United States Patent
Zhang et al.

(10) Patent No.: US 10,917,066 B2
(45) Date of Patent: *Feb. 9, 2021

(54) INPUT/OUTPUT APPARATUS OF MULTIPLEXER, AND MULTIPLEXER

(71) Applicant: Huawei Technologies Co., Ltd., Shenzhen (CN)

(72) Inventors: Xiaofeng Zhang, Kista (SE); Lixia Qiu, Chengdu (CN); Ke Chen, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/731,801

(22) Filed: Dec. 31, 2019

(65) Prior Publication Data

US 2020/0136583 A1    Apr. 30, 2020

Related U.S. Application Data

(63) Continuation of application No. 15/796,239, filed on Oct. 27, 2017, now Pat. No. 10,530,326, which is a
(Continued)

(30) Foreign Application Priority Data

Apr. 29, 2015   (CN) ........................... 2015 1 0214812

(51) Int. Cl.
*H03H 7/46* (2006.01)
*H01P 1/213* (2006.01)

(52) U.S. Cl.
CPC ............. *H03H 7/461* (2013.01); *H01P 1/213* (2013.01); *H01P 1/2136* (2013.01)

(58) Field of Classification Search
CPC ........ H03H 7/461; H01P 1/2136; H01P 1/213
See application file for complete search history.

(56) References Cited

U.S. PATENT DOCUMENTS

| 2,076,248 A | 4/1937 | Norton |
| 4,091,344 A | 5/1978 | Latourrette |
(Continued)

FOREIGN PATENT DOCUMENTS

| CN | 2595111 Y | 12/2003 |
| CN | 101533940 A | 9/2009 |
(Continued)

*Primary Examiner* — Robert J Pascal
*Assistant Examiner* — Kimberly E Glenn
(74) *Attorney, Agent, or Firm* — Leydig, Voit & Mayer, Ltd.

(57) ABSTRACT

An input/output apparatus of a multiplexer is provided, including: a main tap and at least two branch taps of the main tap, where each of the at least two branch taps is configured to couple to a different resonant cavity in the multiplexer, and the at least two branch taps include a first branch tap and a second branch tap; a coupling polarity of the first branch tap is opposite to that of the second branch tap; and a coupling calculation frequency of the second branch tap is closest to a coupling calculation frequency of the first branch tap. The input/output apparatus of the multiplexer enables two channels with closest frequencies to use different coupling polarities. Because the coupling polarities are different, signals naturally do not interfere with each other, and signal interference between channels is eliminated in principle. The embodiments of the present disclosure further provide a corresponding multiplexer.

15 Claims, 7 Drawing Sheets

Related U.S. Application Data continuation of application No. PCT/CN2016/075607, filed on Mar. 4, 2016.

(56) References Cited

U.S. PATENT DOCUMENTS

| | | |
|---|---|---|
| 6,335,663 B1 | 1/2002 | Satoh et al. |
| 6,833,754 B2 | 12/2004 | Lancaster |
| 2003/0011444 A1 | 1/2003 | Wang |
| 2006/0267707 A1 | 11/2006 | Tang et al. |
| 2012/0063471 A1 | 3/2012 | Yin et al. |
| 2014/0347148 A1* | 11/2014 | Ruiz-Cruz ............ H01P 1/205 333/203 |
| 2015/0130562 A1 | 5/2015 | Seo et al. |

FOREIGN PATENT DOCUMENTS

| | | |
|---|---|---|
| CN | 102386463 A | 3/2012 |
| CN | 202196844 U | 4/2012 |
| CN | 203367455 U | 12/2013 |
| CN | 203760614 U | 8/2014 |
| CN | 104852108 A | 8/2015 |
| CN | 104953213 A | 9/2015 |
| CN | 204696217 U | 10/2015 |
| EP | 1469548 B1 | 11/2008 |
| JP | 5694445 B2 | 4/2015 |
| KR | 101494446 B1 | 2/2015 |

\* cited by examiner

INPUT/OUTPUT APPARATUS OF MULTIPLEXER, AND MULTIPLEXER

CROSS-REFERENCE TO RELATED APPLICATIONS

This application is a continuation of U.S. patent application Ser. No. 15/796,239, filed on Oct. 27, 2017, which is a continuation of International Application No. PCT/CN2016/075607, filed on Mar. 4, 2016. The International Application claims priority to Chinese Patent Application No. 201510214812.0, filed on Apr. 29, 2015. All of the aforementioned patent applications are hereby incorporated by reference in their entireties.

TECHNICAL FIELD

The present disclosure relates to the field of multiplexer technologies, and in particular, to an input/output apparatus of a multiplexer, and a multiplexer.

BACKGROUND

As communications base stations are highly integrated, there is a growing demand for multiplexers. For a multiplexer, a core technology is an input/output apparatus of the multiplexer. In the prior art, each tap in an input/output apparatus is connected to a resonant cavity by means of welding.

From a perspective of receiving signals by a base station, a signal received by an antenna enters a multiplexer from an input/output apparatus of the multiplexer; and signals of different frequencies flow into multiplexer channels of different frequencies. Because a difference between the frequencies of the signals on the channels is generally small, signal interference between the channels is very high. In contrast, from a perspective of outputting signals from the multiplexer, the same applies to a reverse process, that is, signal interference between the channels is very high.

In the prior art, to reduce signal interference between channels, a fly lever is added to a resonant cavity for phase adjustment. Signal interference between channels is reduced by means of phase adjustment. However, because phase adjustment is hard in this mode, signal interference between channels cannot be completely eliminated.

SUMMARY

Embodiments of the present disclosure provide an input/output apparatus of a multiplexer, and a multiplexer, so as to eliminate signal interference between different channels in a multiplexer.

A first aspect of the present disclosure provides an input/output apparatus of a multiplexer, including:

a main tap and at least two branch taps of the main tap, where each of the at least two branch taps is configured to couple to a different resonant cavity in the multiplexer, and the at least two branch taps include a first branch tap and a second branch tap; and a coupling polarity of the first branch tap is opposite to that of the second branch tap, and a coupling calculation frequency of the second branch tap is closest to a coupling calculation frequency of the first branch tap.

With reference to the first aspect, in a first possible implementation, an arrangement of the at least two branch taps includes at least two layers in a vertical direction.

With reference to the first aspect or the first possible implementation of the first aspect, in a second possible implementation, the first tap is capacitively coupled, and the second tap is inductively coupled; or, the first tap is inductively coupled, and the second tap is capacitively coupled.

A second aspect of the present disclosure provides a multiplexer, including: an input/output apparatus, a resonant cavity, and a mounting plate, where the resonant cavity is disposed into the mounting plate;

the input/output apparatus includes a main tap and at least two first-level branch taps of the main tap, where each of the at least two first-level branch taps is coupled to a different first-level resonant cavity, and the at least two first-level branch taps include a first first-level branch tap and a second first-level branch tap; and a coupling polarity of the first first-level branch tap is opposite to that of the second first-level branch tap, and a coupling calculation frequency of the second first-level branch tap is closest to a coupling calculation frequency of the first first-level branch tap.

With reference to the second aspect, in a first possible implementation, at least one first-level resonant cavity is connected to at least two second-level branch taps, where each of the at least two second-level branch taps is coupled to a different second-level resonant cavity, and the at least two second-level branch taps include a first second-level branch tap and a second second-level branch tap; and a coupling polarity of the first second-level branch tap is opposite to that of the second second-level branch tap, and a coupling calculation frequency of the second second-level branch tap is closest to a coupling calculation frequency of the first second-level branch tap.

With reference to the second aspect or the first possible implementation of the second aspect, in a second possible implementation, an arrangement of the first-level branch taps includes at least two layers in a vertical direction.

With reference to the second aspect or the first or the second possible implementation of the second aspect, in a third possible implementation, a boss is disposed on the mounting plate, and the boss is configured to physically connect to a branch tap to the boss directly when the branch tap is capacitively coupled to a resonant cavity.

With reference to the third possible implementation of the second aspect, in a fourth possible implementation, an adjustment screw is further disposed on the mounting plate, and the adjustment screw is configured to adjust coupling strength of capacitive coupling.

With reference to any one of the second aspect, or the first to the fourth possible implementations of the second aspect, in a fifth possible implementation, the first first-level branch tap is capacitively coupled, and the second first-level branch tap is inductively coupled; or, the first first-level branch tap is inductively coupled, and the second first-level branch tap is capacitively coupled.

A third aspect of the present disclosure provides a multiplexer, including a resonant cavity, where when there are at least two levels of resonant cavities, each of at least one first-level resonant cavity is coupled to a different second-level resonant cavity via at least two taps, where the at least two taps include a first tap and a second tap; and a coupling polarity of the first tap is opposite to that of the second tap, and a coupling calculation frequency of the second tap is closest to a coupling calculation frequency of the first tap.

With reference to the third aspect, in a first possible implementation, the multiplexer further includes an input/output apparatus, where a tap of the input/output apparatus is connected to the first-level resonant cavity.

The input/output apparatus of a multiplexer provided in the embodiments of the present disclosure includes: a main tap and at least two branch taps of the main tap, where each of the at least two branch taps is configured to couple to a different resonant cavity in the multiplexer, and the at least two branch taps include a first branch tap and a second branch tap; a coupling polarity of the first branch tap is opposite to that of the second branch tap; and a coupling calculation frequency of the second branch tap is closest to a coupling calculation frequency of the first branch tap. Compared with the prior art in which signal interference between channels in a multiplexer is reduced by means of phase adjustment using a fly lever, in the input/output apparatus of a multiplexer provided in the embodiments of the present disclosure, a coupling polarity of the first branch tap is opposite to that of the second branch tap; and a coupling calculation frequency of the second branch tap is closest to a coupling calculation frequency of the first branch tap, so that two channels with closest frequencies use different coupling polarities. Because the coupling polarities are different, signals naturally do not interfere with each other, and signal interference between channels is eliminated in principle.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and persons skilled in the art may still derive other drawings from these accompanying drawings without creative efforts.

DESCRIPTION OF EMBODIMENTS

The embodiments of the present disclosure provide an input/output apparatus of a multiplexer, and a multiplexer, so as to eliminate signal interference between different channels in the multiplexer. The following provides respective details.

The following clearly and completely describes the technical solutions in the embodiments of the present disclosure with reference to the accompanying drawings in the embodiments of the present disclosure. Apparently, the described embodiments are merely some but not all of the embodiments of the present disclosure. All other embodiments obtained by persons skilled in the art based on the embodiments of the present disclosure without creative efforts shall fall within the protection scope of the present disclosure.

It should be noted that, the multiplexer provided in the embodiments of the present disclosure includes various forms, for example, a duplexer, a tri-plexer, a quad-plexer, or more-channel multiplexer.

The embodiments of the present disclosure achieve an objective of reducing mutual interference between channels with a same frequency or close frequencies by using an opposite-polarity coupling method on taps for the channels with the same frequency or close frequencies.

Figure 1:
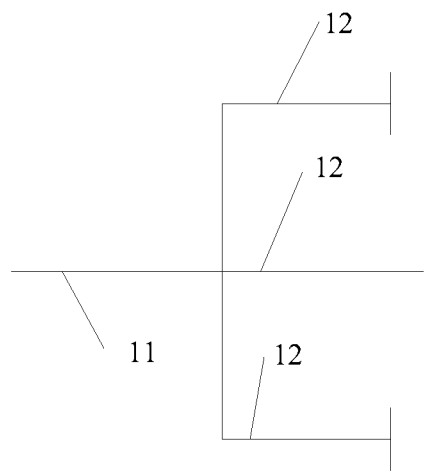
FIG. 1 is a schematic principle diagram of an input/output apparatus according to an embodiment of the present disclosure.
Figure 2:
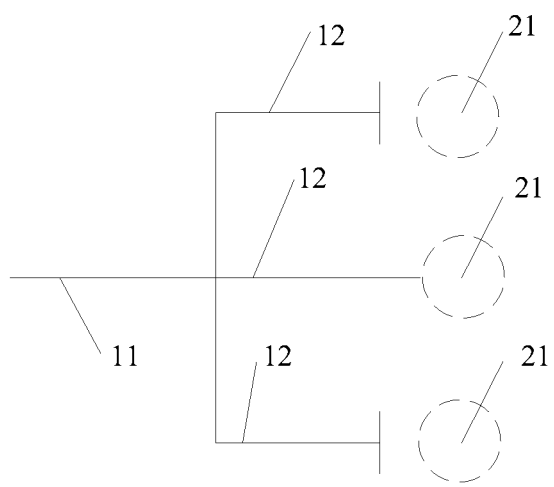
FIG. 2 is another schematic principle diagram of an input/output apparatus according to an embodiment of the present disclosure.
Figure 3:
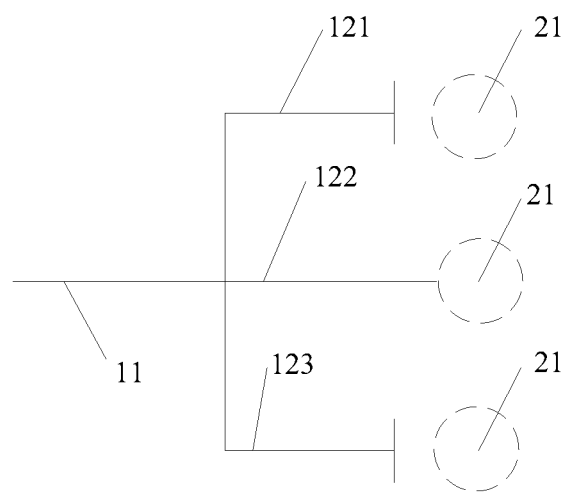
FIG. 3 is another schematic principle diagram of an input/output apparatus according to an embodiment of the present disclosure.

FIG. 1, FIG. 2, and FIG. 3 are schematic principle diagrams of an input/output apparatus according to embodiments of the present disclosure. In FIG. 2, a resonant cavity is indicated by a dashed line, meaning that the resonant cavity is a constituent part of the multiplexer instead of a constituent part of the input/output apparatus. As shown in FIG. 1 and FIG. 2, the input/output apparatus of the multiplexer includes: a main tap 11 and at least two branch taps 12 of the main tap 11. FIG. 1 and FIG. 2 each show three branch taps. In practice, there may be two branch taps, or may be four or more branch taps. This, however, does not limit a quantity of branch taps of the main channel. As shown in FIG. 2, each of the at least two branch taps 12 is configured to couple to a different resonant cavity 21 in the multiplexer. As shown in FIG. 3, it is assumed that there are three branch taps of the main tap 11: a first branch tap 121, a second branch tap 122, and a third branch tap 123. Certainly, the first, the second, and the third herein do not represent a sequence or definite meanings, but are just for the ease of description. A coupling polarity of the first branch tap 121 is opposite to that of the second branch tap 122, and the coupling polarity of the second branch tap 122 is opposite to that of the third branch tap 123. A coupling calculation frequency of the first branch tap 121 is closest to a coupling calculation frequency of the second branch tap 122, and the coupling calculation frequency of the second branch tap 122 is closest to a coupling calculation frequency of the third branch tap 123.

In this embodiment of the present disclosure, the coupling calculation frequency is a frequency used when it is determined whether the coupling polarity of the first branch tap is opposite to that of the second branch tap. The coupling calculation frequency may be an operating frequency of a resonant cavity to which each tap is connected. The operating frequency may be a frequency at a point (for example, 1800 MHz or 900 MHz), or may be a frequency in a frequency band (for example, for application in a base station, a transmit frequency band 1805 MHz to 1880 MHz of the base station). In practice, usually, a central point frequency of a resonant cavity to which each tap is connected (sometimes is a central point frequency of a tap in this embodiment of the present disclosure) is used, or the highest frequency and the lowest frequency of an operating band of the resonant cavity to which each tap is connected may be compared. For example, when the central point frequency is used as the coupling calculation frequency, a central point frequency of the first branch tap 121 is 3 Hz, a central point frequency of the second branch tap 122 is 7 Hz, and a central point frequency of the third branch tap 123 is 13 Hz. It can be learnt that a difference between the central point frequency of the first branch tap 121 and the central point frequency of the second branch tap 122 is 4 Hz, and a difference between the central point frequency of the first branch tap 121 and the central point frequency of the third branch tap 123 is 10 Hz. In this way, it can be determined that the central point frequency of the first branch tap 121 is closest to the central point frequency of the second branch tap 122. Therefore, the coupling polarity of the first branch tap 121 is opposite to that of the second branch tap 122. As shown in FIG. 3, it may be set that the first branch tap 121 is capacitively coupled, and that the second branch tap 122 is inductively coupled. Alternatively, certainly, it may be set that the first branch tap 121 is inductively coupled, and that the second branch tap 122 is capacitively coupled. A difference between the central point frequency of the third branch tap 123 and the central point frequency of the first branch tap 121 is 10 Hz, and a difference between the central point frequency of the third branch tap 123 and the central point frequency of the second branch tap 122 is 6 Hz. In this way, it may be determined that the coupling polarity of the third branch tap 123 is opposite to that of the second branch tap 122. When the second branch tap 122 is inductively coupled, the third branch tap 123 is capacitively coupled. When the second branch tap 122 is capacitively coupled, the third branch tap 123 is inductively coupled.

It should be noted herein that the closest described in this embodiment of the present disclosure is not limited to only one. For example, when a difference between the central point frequency of the second branch tap 122 and the central point frequency of the first branch tap 121 is 4 Hz, and a difference between the central point frequency of the second branch tap 122 and the central point frequency of the third branch tap 123 is still 4 Hz, it may be considered that the central point frequency of the second branch tap 122 is closest to both the central point frequency of the first branch tap 121 and the central point frequency of the third branch tap 123. When the second branch tap is inductively coupled, the first branch tap 121 and the third branch tap 123 are both capacitively coupled. When the second branch tap is capacitively coupled, the first branch tap 121 and the third branch tap 123 are both inductively coupled.

When the highest and the lowest frequencies of the tap operating band are used as the coupling calculation frequency, the lowest operating frequency of a tap with higher frequencies is preferably closest to the highest operating frequency of a tap with lower frequencies. For example, an operating band of the first branch tap 121 is 1 to 5, that is, the lowest frequency of the first branch tap 121 is 1 Hz, and the highest frequency is 5 Hz; an operating band of the second branch tap 122 is 7 to 9, that is, the lowest frequency of the second branch tap 122 is 7 Hz, and the highest frequency is 9 Hz; and an operating band of the third branch tap 123 is 12 to 15, that is, the lowest frequency of the third branch tap 123 is 12 Hz, and the highest frequency is 15 Hz.

The highest frequency 5 Hz of the first branch tap 121 differs from the lowest frequency 7 Hz of the second branch tap 122 by 2 Hz, and differs from the lowest frequency 12 Hz of the third branch tap 123 by 7 Hz. In this way, it may be determined that the coupling calculation frequency of the first branch tap 121 is closest to that of the second branch tap 122. When the first branch tap 121 is capacitively coupled, the second branch tap 122 is inductively coupled. Alternatively, certainly, it may be that, when the first branch tap 121 is inductively coupled, the second branch tap 122 is capacitively coupled. The lowest frequency 12 Hz of the third branch tap 123 differs from the highest frequency 5 Hz of the first branch tap 121 by 7 Hz, and the lowest frequency 12 Hz of the third branch tap 123 differs from the highest frequency 9 Hz of the second branch tap 121 by 3 Hz. In this way, it may be determined that the coupling calculation frequency of the third branch tap 123 is closest to that of the second branch tap 121. When the second branch tap 122 is inductively coupled, the third branch tap 123 is capacitively coupled. When the second branch tap 122 is capacitively coupled, the third branch tap 123 is inductively coupled. In production, a coupling polarity of each tap may be determined according to an ascending order or a descending order. This is not limited herein.

Figure 4:
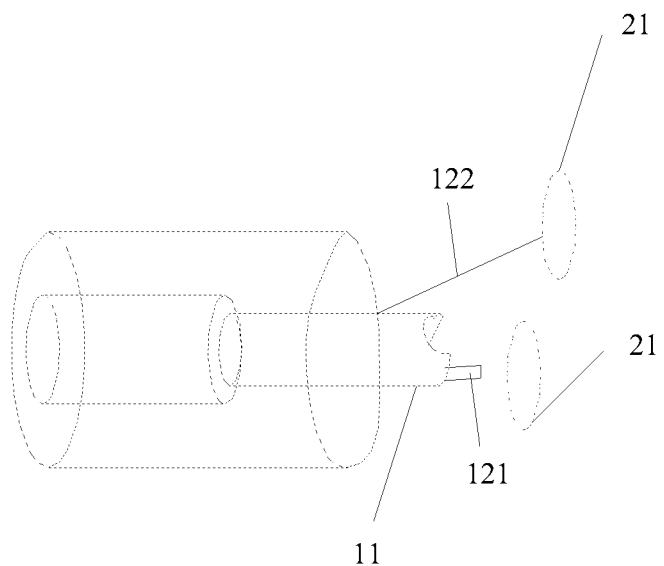
FIG. 4 is a schematic structural diagram of an input/output apparatus according to an embodiment of the present disclosure.

FIG. 4 is a schematic structural diagram of an input/output apparatus according to an embodiment of the present disclosure. As shown in FIG. 4, the input/output apparatus includes a main tap 11, a first branch tap 121, and a second branch tap 122. The first branch tap 121 and the second branch tap 122 are respectively coupled to resonant cavities of a multiplexer. The first branch tap 121 is capacitively coupled, and the second branch tap 122 is inductively coupled. Capacitive coupling in this embodiment of the present disclosure refers to a capacitive relationship formed between a branch tap and a resonant cavity. As shown in FIG. 4, the first branch tap 121 is in no contact with its corresponding resonant cavity, and capacitive space is formed, so as to build a capacitive coupling relationship between the first branch tap 121 and its corresponding resonant cavity. Inductive coupling refers to an inductive relationship formed between a branch tap and a corresponding resonant cavity. As shown in FIG. 4, the second branch tap 122 is in direct contact with its corresponding resonant cavity, and inductive space is formed, so as to build an inductive coupling relationship between the second branch tap 122 and its corresponding resonant cavity. For understanding of a specific capacitive coupling structure and a specific inductive coupling structure in this embodiment of the present disclosure, refer to prior-art capacitive coupling and inductive coupling schemes in other aspects, or the capacitive coupling structure and the inductive coupling structure in this embodiment of the present disclosure may be new schemes developed later. This does not affect application of the present disclosure and is not described in detail herein. In addition, in FIG. 4, a resonant cavity is indicated by a dashed line, meaning that the resonant cavity is a constituent part of the multiplexer instead of a constituent part of the input/output apparatus.

Additionally, all branch taps may be arranged on one horizontal layer. Alternatively, one branch tap may be located on one horizontal layer, and there are layers whose quantity is the same as that of branch taps in a vertical direction. Alternatively, one or more branch taps may be arranged on one horizontal layer, and there are at least two layers of branch taps in the vertical direction.

In the input/output apparatus of the multiplexer provided in this embodiment of the present disclosure, a coupling polarity of the first branch tap is opposite to that of the second branch tap; and a coupling calculation frequency of the second branch tap is closest to a coupling calculation frequency of the first branch tap, so that two channels with closest frequencies use different coupling polarities. Because the coupling polarities are different, signals naturally do not interfere with each other, and signal interference between channels is eliminated in principle.

Figure 5:
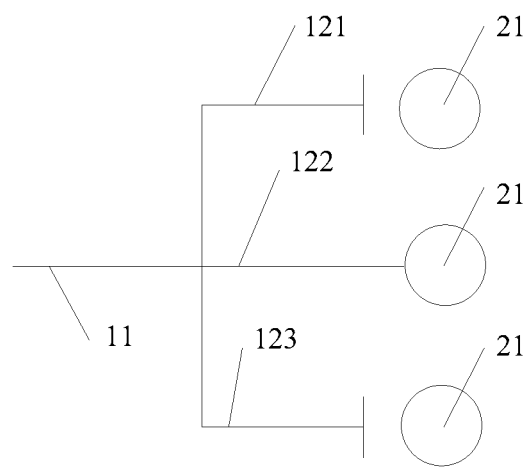
FIG. 5 is a schematic principle diagram of a multiplexer according to an embodiment of the present disclosure.

FIG. 5 is a schematic principle diagram of a multiplexer according to an embodiment of the present disclosure. As shown in FIG. 5, the multiplexer includes: a main tap 11 and at least two first-level branch taps 12 (three branch taps are shown in FIG. 1, but this does not limit a quantity of branch taps of the main channel) that are in an input/output apparatus, and a resonant cavity 21. Although not shown in FIG. 3, a mounting plate may be further included in the multiplexer actually, and the resonant cavity 21 is disposed into the mounting plate. Each of the at least two first-level branch taps is coupled to a different first-level resonant cavity 21. Three first-level branch taps shown in FIG. 5 include a first first-level branch tap 121, a second first-level branch tap 122, and a third first-level branch tap 123. Certainly, there may be only two first-level branch taps or more first-level branch taps. This is not specifically limited herein. In this embodiment of the present disclosure, three first-level branch taps are used as an example for description.

A coupling polarity of the first first-level branch tap 121 is opposite to that of the second first-level branch tap 122. A coupling calculation frequency of the second first-level branch tap 122 is closest to a coupling calculation frequency of the first first-level branch tap 121. A coupling calculation frequency of a first-level branch tap is a frequency used in calculation to determine coupling polarities of the first first-level branch tap and the second first-level branch tap.

In this embodiment of the present disclosure, for a definition of the coupling calculation frequency and how to determine the closest coupling calculation frequencies, refer to descriptions corresponding to FIG. 3. Details are not further described herein.

Figure 6:
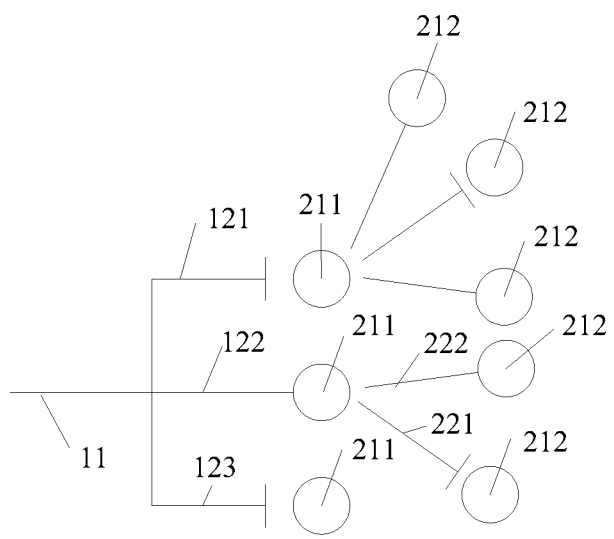
FIG. 6 is another schematic principle diagram of a multiplexer according to an embodiment of the present disclosure.

FIG. 6 is another schematic principle diagram of a multiplexer according to an embodiment of the present disclosure. As shown in FIG. 6, the multiplexer includes: a main tap 11, and three first-level branch taps, which are respectively a first first-level branch tap 121, a second first-level branch tap 122, and a third first-level branch tap 123. A polarity of coupling the first first-level branch tap 121 to a first-level resonant cavity 211 is opposite to a polarity of coupling the second first-level branch tap 122 to the first-level resonant cavity 211. As shown in FIG. 6, a polarity of coupling the first first-level branch tap 121 to the resonant cavity is capacitive coupling, and a polarity of coupling the second first-level branch tap 122 to the resonant cavity is inductive coupling. Certainly, it may alternatively be that a polarity of coupling the first first-level branch tap 121 to the resonant cavity is inductive coupling, and a polarity of coupling the first first-level branch tap 122 to the resonant cavity is capacitive coupling.

Among first-level resonant cavities 211, at least one first-level resonant cavity 211 is connected to at least two second-level branch taps. Each of the at least two second-level branch taps is coupled to a different second-level resonant cavity 212. The at least two second-level branch taps include a first second-level branch tap 221 and a second second-level branch tap 222.

A coupling polarity of the first second-level branch tap 221 is opposite to that of the second second-level branch tap 222. A coupling calculation frequency of the second second-level branch tap 222 is closest to a coupling calculation frequency of the first second-level branch tap 221. A coupling calculation frequency of a second-level branch tap is a frequency used in calculation to determine coupling polarities of the first second-level branch tap and the second second-level branch tap.

In this embodiment of the present disclosure, for a definition of the coupling calculation frequency and how to determine the closest coupling calculation frequencies, refer to descriptions corresponding to FIG. 3. Details are not further described herein.

As shown in FIG. 6, a polarity of coupling the first second-level branch tap 221 to the resonant cavity is capacitive coupling, and a polarity of coupling the second second-level branch tap 222 to the resonant cavity is inductive coupling. Certainly, it may alternatively be that a polarity of coupling the first second-level branch tap 221 to the resonant cavity is inductive coupling, and a polarity of coupling the second second-level branch tap 222 to the resonant cavity is capacitive coupling.

Figure 7:
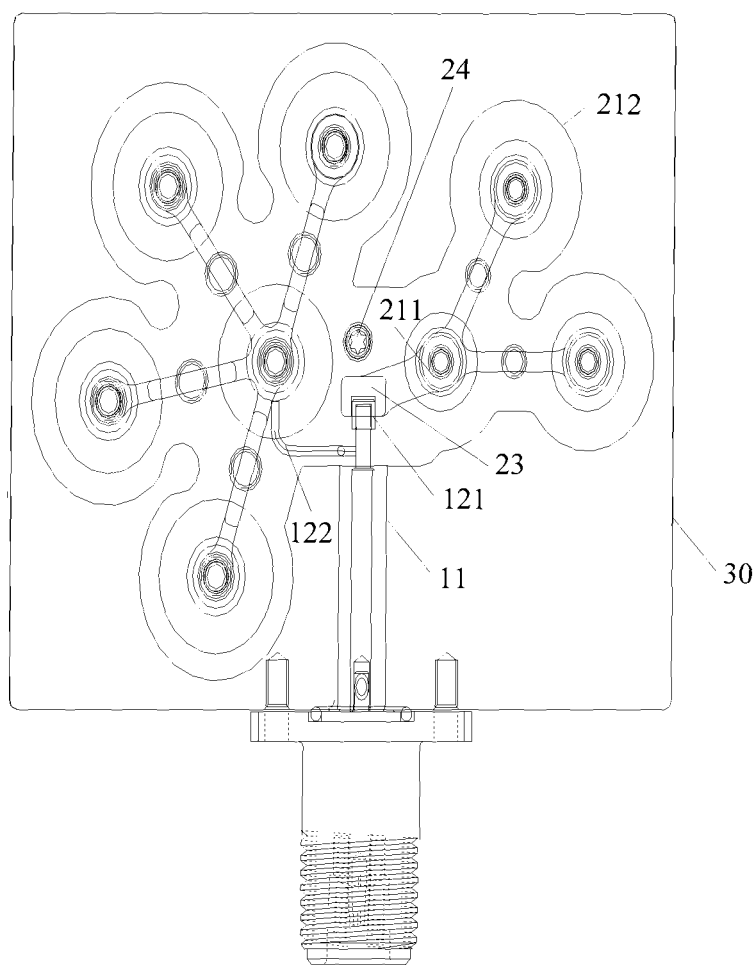
FIG. 7 is a schematic structural diagram of a multiplexer according to an embodiment of the present disclosure.

FIG. 7 is a schematic structural diagram of a multiplexer according to an embodiment of the present disclosure. FIG. 7 is a schematic structural diagram of a hexa-plexer. As shown in FIG. 7, the multiplexer includes a mounting plate 30, a first-level resonant cavity 211, and a second-level resonant cavity 212. The first-level resonant cavity 211 and the second-level resonant cavity 212 are both disposed into the mounting plate 30. The multiplexer further includes a main tap 11, a first first-level branch tap 121, and a second first-level branch tap 122. A coupling polarity of the first first-level branch tap 121 is capacitive coupling, and a coupling polarity of the second first-level branch tap 122 is inductive coupling. A boss 23 is disposed on the mounting plate 30, and the boss is configured to physically and directly connect to a branch tap to the boss 23 when the branch tap is capacitively coupled to a resonant cavity. In this way, capacitive space is formed between the boss 23 and a corresponding resonant cavity to implement capacitive coupling. It may also be understood that a boss 23 is disposed for a resonant cavity that implements capacitive coupling. A corresponding boss 23 is disposed on each resonant cavity configured to implement capacitive coupling. A tap capacitively coupled to a resonant cavity may be inserted into the boss 23 directly, so as to couple to the resonant cavity. Disposition of the boss 23 can facilitate mounting for capacitive coupling. A specific position, method, and the like for disposing the boss may be determined according to specific product requirements, and are not limited herein. A material of the boss may be a conducting material, such as metal. For example, the boss may use a same material as a cavity body of the resonant cavity. For example, the first first-level branch tap 121 is capacitively coupled, and the first first-level branch tap 121 is physically and directly connected to a boss 23 of the first-level resonant cavity 211 corresponding to the first first-level branch tap 121. That is, the first first-level branch tap 121 is directly inserted into the boss 23 of the first-level resonant cavity 211 corresponding to the first first-level branch tap 121. An adjustment screw 24 is further disposed on the mounting plate 30. The adjustment screw 24 is configured to adjust coupling strength of capacitive coupling. That is, a depth by which the adjustment screw 24 is inserted into the mounting plate 30 directly affects the coupling strength of capacitive coupling.

Figure 8:
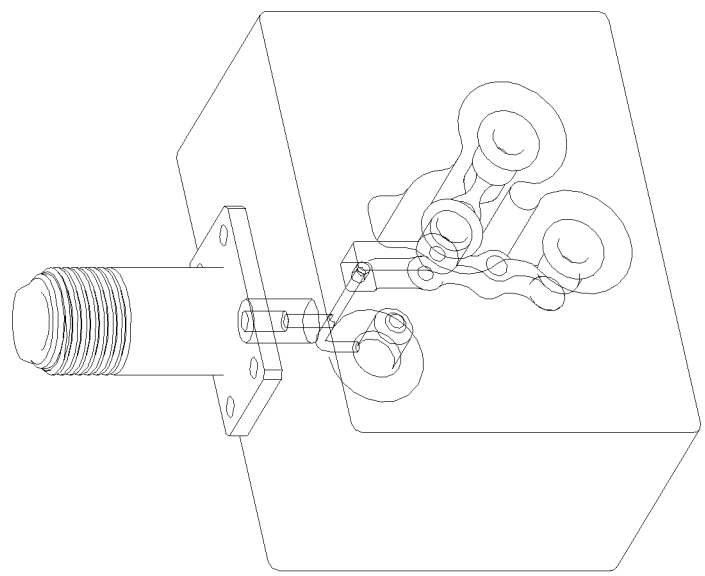
FIG. 8 is another schematic structural diagram of a multiplexer according to an embodiment of the present disclosure.
Figure 9:
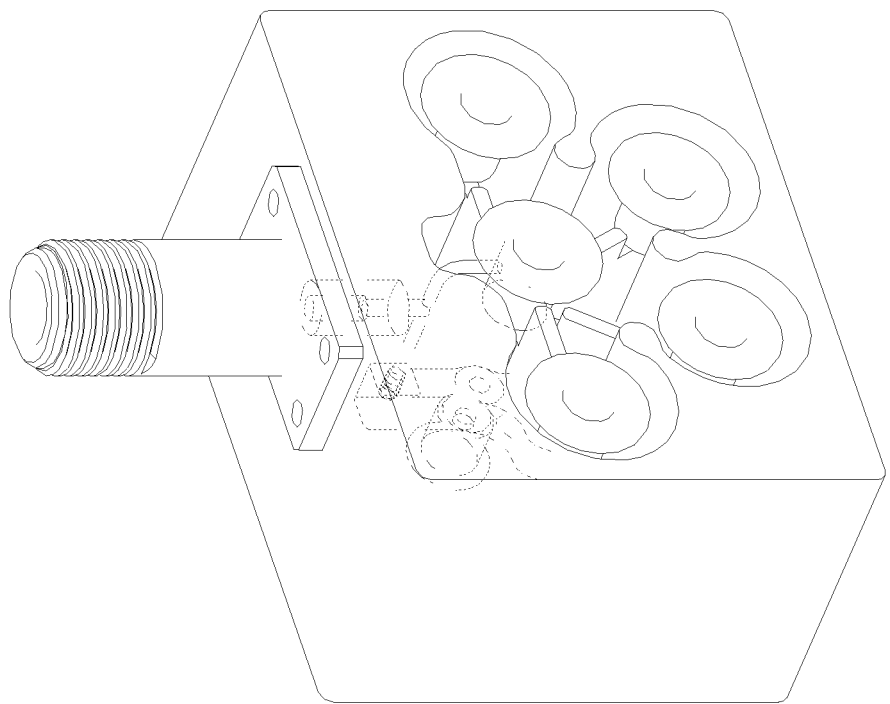
FIG. 9 is another schematic structural diagram of a multiplexer according to an embodiment of the present disclosure.

FIG. 8 and FIG. 9 are both schematic structural diagrams of a multiplexer according to embodiments of the present disclosure. The multiplexers shown in FIG. 8 and FIG. 9 may be layered in a vertical direction. As shown in FIG. 8 and FIG. 9, when there are only two first-level branch taps, the two branch taps may be arranged in two layers in a vertical direction, so that a horizontal area of the multiplexer can be reduced. An actual quantity of layers is not limited to two, but can be specifically designed according to a quantity of taps.

In the embodiments of the present disclosure, a physical structure of opposite-polarity coupling is used to eliminate interference between channels of a multiplexer in principle. Because the interference between channels is eliminated, debugging difficulty can be greatly reduced, and debugging efficiency of the multiplexer is improved.

Compared with a traditional solution, structures of the input/output apparatus and the multiplexer that are provided in the embodiments of the present disclosure have simpler structures and are easier to assemble. Production difficulty can be reduced, and assembly efficiency is improved. Additionally, coupling strength of a capacitive tap can be adjusted to allow for a greater assembly tolerance.

Figure 10:
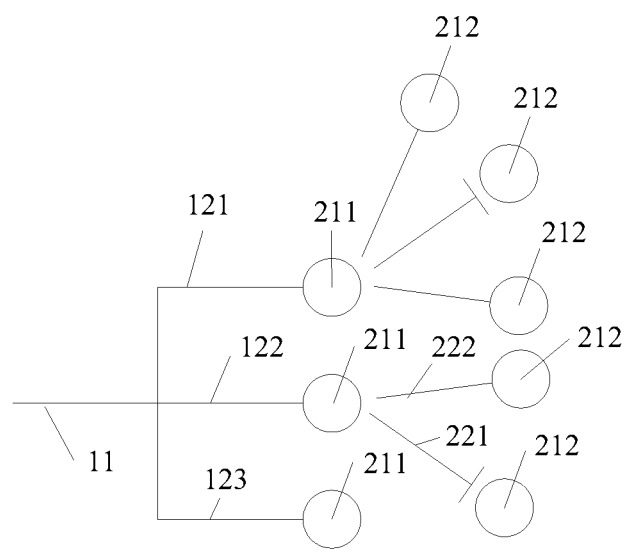
FIG. 10 is another schematic principle diagram of a multiplexer according to an embodiment of the present disclosure.

As shown in FIG. 10, a multiplexer provided in an embodiment of the present disclosure includes a resonant cavity.

When there are at least two levels of resonant cavities, each of at least one first-level resonant cavity is coupled to a different second-level resonant cavity via at least two taps. The at least two taps include a first tap 221 and a second tap 222.

A coupling polarity of the first tap 221 is opposite to that of the second tap 222, and a coupling calculation frequency of the second tap 222 is closest to a coupling calculation frequency of the first tap 221.

Optionally, the multiplexer may further include an input/output apparatus. All taps of the input/output apparatus are directly connected to the resonant cavity, for example, welded to the resonant cavity.

In this embodiment of the present disclosure, for a definition of the coupling calculation frequency and how to determine the closest coupling calculation frequencies, refer to descriptions corresponding to FIG. 3. Details are not further described herein.

Figure 11:
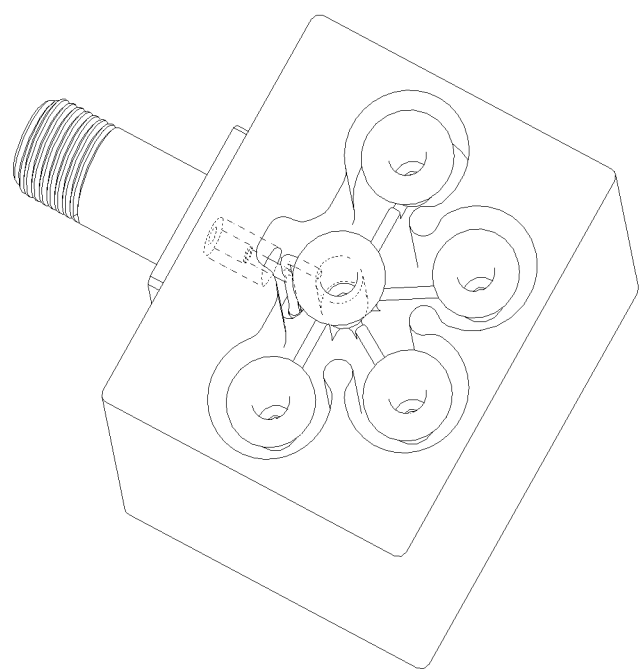
FIG. 11 is another schematic structural diagram of a multiplexer according to an embodiment of the present disclosure.

As shown in FIG. 11, in a quad-plexer provided in an embodiment of the present disclosure, a main tap is directly connected to a first-level resonant cavity. Four branch taps extend from the first-level resonant cavity, and each branch tap is coupled to a second-level resonant cavity. A polarity of coupling to the second-level resonant cavity is determined according to a coupling calculation frequency. Coupling polarities of two branch taps with closest coupling calculation frequencies are opposite. This eliminates interference between channels in principle.

The multiplexer provided in any one of the foregoing embodiments of the present disclosure can be applied to, such as a radio frequency unit, a base station, a communications system, and a radar system in the communications industry. Any multiplexer-involved system or device that uses the multiplexer provided in the embodiments of the present disclosure, or any multiplexer or other communications devices manufactured by using the solutions or principles provided in the embodiments of the present disclosure, can achieve the effects described in the embodiments of the present disclosure.

The foregoing describes in detail the input/output apparatus of a multiplexer, and the multiplexer that are provided in the embodiments of the present disclosure. Although the principle and implementations of the present disclosure are described with reference to specific examples, the descriptions of the embodiments of the present disclosure are merely provided to help understand the method and the core idea of the present disclosure. In addition, persons of ordinary skill in the art can make variations and modifications to the present disclosure with respect to specific implementation and the application scope according to the idea of the present disclosure. Therefore, the content of this specification shall not be construed as a limitation on the present disclosure.

What is claimed is:

1. An input/output apparatus of a multiplexer, the input/output apparatus comprising:
   a main tap; and
   at least two branch taps of the main tap, wherein each branch tap of the at least two branch taps is configured to couple to a different resonant cavity in the multiplexer, and the at least two branch taps comprise a first branch tap and a second branch tap;
   wherein a coupling polarity of the first branch tap is opposite to a coupling polarity of the second branch tap.

2. The input/output apparatus according to claim 1, wherein an arrangement of the at least two branch taps comprises at least two layers in a vertical direction.

3. The input/output apparatus according to claim 1, wherein the first branch tap is capacitively coupled, and the second branch tap is inductively coupled.

4. The input/output apparatus according to claim 1, wherein each branch tap of the at least two branch taps includes a coupling calculation frequency, and a coupling calculation frequency of the first branch tap is closest to a coupling calculation frequency of the second branch tap among the branch taps included in the at least two branch taps.

5. A multiplexer, comprising:
   an input/output apparatus comprising a main tap and at least two first-level branch taps of the main tap, wherein each first-level branch tap of the at least two first-level branch taps is coupled to a different first-level resonant cavity, and the at least two first-level branch taps comprise a first first-level branch tap and a second first-level branch tap;
   wherein a coupling polarity of the first first-level branch tap is opposite to a coupling polarity of the second first-level branch tap.

6. The multiplexer according to claim 5, wherein:
   at least one first-level resonant cavity is connected to at least two second-level branch taps, wherein each of the at least two second-level branch taps is coupled to a different second-level resonant cavity, and the at least two second-level branch taps comprise a first second-level branch tap and a second second-level branch tap; and
   a coupling polarity of the first second-level branch tap is opposite to that of the second second-level branch tap, and a coupling calculation frequency of the second second-level branch tap is closest to a coupling calculation frequency of the first second-level branch tap among the second-level branch taps included in the at least two second-level branch taps.

7. The multiplexer according to claim 5, wherein an arrangement of the first-level branch taps comprises at least two layers in a vertical direction.

8. The multiplexer according to claim 5, further comprising:
a mounting plate; and
a boss, wherein the boss is disposed on the mounting plate, and the boss is configured to physically connect to a first-level branch tap directly when the first-level branch tap is capacitively coupled to a first-level resonant cavity.

9. The multiplexer according to claim 8, wherein an adjustment screw is further disposed on the mounting plate, and the adjustment screw is configured to adjust coupling strength of capacitive coupling.

10. The multiplexer according to claim 5, wherein the first first-level branch tap is capacitively coupled, and the second first-level branch tap is inductively coupled.

11. The multiplexer according to claim 5, wherein each first-level branch tap of the at least two first-level branch taps includes a coupling calculation frequency, and a coupling calculation frequency of the first first-level branch tap is closest to a coupling calculation frequency of the second first-level branch tap among the first-level branch taps included in the at least two first-level branch taps.

12. A multiplexer, comprising:
resonant cavities;
wherein there are at least two levels of the resonant cavities, each first-level resonant cavity of at least one first-level resonant cavity is coupled to a different second-level resonant cavity via at least two taps;
wherein the at least two taps include a first tap and a second tap; and
wherein a coupling polarity of the first tap is opposite to a coupling polarity of the second tap, and a coupling calculation frequency of the second tap is closest to a coupling calculation frequency of the first tap.

13. The multiplexer according to claim 12, wherein the multiplexer further comprises:
an input/output apparatus, wherein taps of the input/output apparatus are connected to the resonant cavities.

14. An radio unit, comprising:
an input/output apparatus of a multiplexer, wherein the input/output apparatus comprises:
a main tap; and
at least two branch taps of the main tap, wherein each branch tap of the at least two branch taps is configured to couple to a different resonant cavity in the multiplexer, and the at least two branch taps comprise a first branch tap and a second branch tap;
wherein a coupling polarity of the first branch tap is opposite to a coupling polarity of the second branch tap.

15. A base station, comprising:
a radio unit comprising an input/output apparatus of a multiplexer, wherein the input/output apparatus comprises:
a main tap; and
at least two branch taps of the main tap, wherein each branch tap of the at least two branch taps is configured to couple to a different resonant cavity in the multiplexer, and the at least two branch taps comprise a first branch tap and a second branch tap;
wherein a coupling polarity of the first branch tap is opposite to a coupling polarity of the second branch tap.

* * * * *